(12) United States Patent
Shimoi et al.

(10) Patent No.: US 8,685,269 B2
(45) Date of Patent: Apr. 1, 2014

(54) LASER PROCESSING METHOD

(75) Inventors: Hideki Shimoi, Hamamatsu (JP); Keisuke Araki, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 60 days.

(21) Appl. No.: 13/388,717

(22) PCT Filed: Jul. 19, 2011

(86) PCT No.: PCT/JP2011/066322
§ 371 (c)(1),
(2), (4) Date: Feb. 3, 2012

(87) PCT Pub. No.: WO2012/014711
PCT Pub. Date: Feb. 2, 2012

(65) Prior Publication Data
US 2012/0129348 A1 May 24, 2012

(30) Foreign Application Priority Data

Jul. 26, 2010 (JP) .................................. 2010-167426

(51) Int. Cl.
*B44C 1/22* (2006.01)
(52) U.S. Cl.
USPC ............... 216/87; 216/99; 438/705; 438/753; 438/795; 257/E21.328; 257/E21.347
(58) Field of Classification Search
None
See application file for complete search history.

(56) References Cited

U.S. PATENT DOCUMENTS

| | | | |
|---|---|---|---|
| 6,992,026 B2 | 1/2006 | Fukuyo et al. | |
| 7,033,519 B2 | 4/2006 | Taylor et al. | |
| 2002/0151169 A1* | 10/2002 | Umetsu et al. | 438/629 |
| 2005/0272223 A1 | 12/2005 | Fujii et al. | |
| 2010/0136766 A1 | 6/2010 | Sakamoto et al. | |

FOREIGN PATENT DOCUMENTS

| | | |
|---|---|---|
| JP | 4-150212 | 5/1992 |
| JP | 7-40482 | 5/1995 |
| JP | 10-202878 | 8/1998 |
| JP | 2873937 | 1/1999 |
| JP | 2000-246475 | 9/2000 |

(Continued)

OTHER PUBLICATIONS

M. Watanabe, et al., "Femtosecond laser-assisted three-dimensional microfabrication in silica", Mar. 1, 2001, Optics Letters, vol. 26, No. 5, p. 277-279.

*Primary Examiner* — Lan Vinh
*Assistant Examiner* — Jiong-Ping Lu
(74) *Attorney, Agent, or Firm* — Drinker Biddle & Reath LLP (57) ABSTRACT

A laser processing method of converging laser light into an object to be processed made of silicon so as to form a modified region and etching the object along the modified region so as to form the object with a through hole comprises a laser light converging step of converging the laser light at the object so as to form the modified region along a part corresponding to the through hole in the object; an etch resist film producing step of producing an etch resist film resistant to etching on an outer surface of the object after the laser light converging step; and an etching step of etching the object so as to advance the etching selectively along the modified region and form the through hole after the etch resist film producing step; while the laser light converging step exposes the modified region to the outer surface of the object.

4 Claims, 12 Drawing Sheets

(56) References Cited

FOREIGN PATENT DOCUMENTS

| | | |
|---|---|---|
| JP | 2002-210730 | 7/2002 |
| JP | 2004-128445 | 4/2004 |
| JP | 2004-136358 | 5/2004 |
| JP | 2004-160618 | 6/2004 |
| JP | 2004-223586 | 8/2004 |
| JP | 2004-304130 | 10/2004 |
| JP | 2004-351494 | 12/2004 |
| JP | 2004-359475 | 12/2004 |
| JP | 2005-1211 | 1/2005 |
| JP | 2005-74663 | 3/2005 |
| JP | 2005-121915 | 5/2005 |
| JP | 2005-121916 | 5/2005 |
| JP | 2005-144586 | 6/2005 |
| JP | 2005-144622 | 6/2005 |
| JP | 2005-152693 | 6/2005 |
| JP | 2005-169993 | 6/2005 |
| JP | 2005-206401 | 8/2005 |
| JP | 2005-208175 | 8/2005 |
| JP | 2005-306702 | 11/2005 |
| JP | 2005-351774 | 12/2005 |
| JP | 2006-176355 | 7/2006 |
| JP | 2006-290630 | 10/2006 |
| JP | 2006-352171 | 12/2006 |
| JP | 2007-36758 | 2/2007 |
| JP | 2007-101833 | 4/2007 |
| JP | 2009-267247 | 11/2009 |
| JP | 2010-142837 | 7/2010 |
| WO | 00/50198 | 8/2000 |

\* cited by examiner

| Substrate | Etchant |
|---|---|
| Si (isotropic) | Mixed liquid of HNO3(nitric acid),HF(hydrofluoric acid), and H2O(water) or CH3COOH(acetic acid) |
| Si (anisotropic) | KOH(potassium hydroxide),TMAH(aqueous tetramethylammonium hydroxide solution),EDP, NaOH, CsOH, NH4OH, hydrazine, etc. |

LASER PROCESSING METHOD

TECHNICAL FIELD

The present invention relates to a laser processing method and, in particular, to a laser processing method for forming an object to be processed with a through hole.

BACKGROUND ART

Known as a conventional laser processing method is one comprising converging laser light at a sheet-like object to be processed so as to form a modified region within the object and then etching the object so as to remove the modified region, thereby forming the object with a through hole along a thickness direction (see, for example, Patent Literature 1).

CITATION LIST

Patent Literature

Patent Literature 1: Japanese Patent Application Laid-Open No. 2004-351494

SUMMARY OF INVENTION

Technical Problem

There is a case where the above-mentioned laser processing method patterns an etch resist film, which is resistant to etching, on an outer surface of the object before the etching. That is, the etch resist film is produced so as to cover the whole area of the outer surface of the object. There is a case where the etch resist film is thereafter exposed to light and so forth, so as to form an opening for infiltrating an etchant into the modified region in an area corresponding to a denatured layer in the etch resist film. This can restrain the opening side of the resulting through hole from widening in excess by etching, for example, whereby the through hole can be formed accurately. In this case, however, the processing may become complicated and cumbersome, since the step of patterning by exposure to light or the like is additionally necessary as mentioned above.

It is therefore an object of the present invention to provide a laser processing method which can accurately form a through hole and facilitate the processing.

Solution to Problem

One aspect of the present invention relates to a laser processing method. This laser processing method is a laser processing method of converging laser light into an object to be processed made of silicon so as to form a modified region and etching the object along the modified region so as to form the object with a through hole, the method comprising a laser light converging step of converging the laser light at the object so as to form the modified region along a part corresponding to the through hole in the object; an etch resist film producing step of producing an etch resist film resistant to etching on an outer surface of the object after the laser light converging step; and an etching step of etching the object so as to advance the etching selectively along the modified region and form the through hole after the etch resist film producing step; wherein the laser light converging step exposes the modified region to the outer surface of the object.

In this laser processing method, when producing the etch resist film, the etch resist film is inhibited from growing on the modified region exposed to the outer surface of the object. Therefore, on the modified region, the etch resist film is not substantially produced or is produced coarser in terms of density than its surroundings, for example, whereby defects may occur in the etch resist film. Hence, in the etching step, an etchant may infiltrate from the defects in the etch resist film into the modified region, thereby advancing the etching selectively along the modified region. As a consequence, when producing the etch resist film on the outer surface, this laser processing method requires no patterning step by exposure to light or the like, thus making it possible to form the through hole accurately and facilitate the processing.

The object to be processed may be shaped like a sheet having a main face in a (100) plane, the through hole may tilt with respect to the thickness direction of the object, and the etching step may perform anisotropic etching as the etching. This can favorably form the object with the through hole tilted with respect to the thickness direction.

The method may further comprise a step of removing the etch resist film produced on the exposed modified region by etching the etch resist film after the etch resist film producing step before the etching step. This removes defects in the etch resist film, whereby the etchant can reliably infiltrate into the modified region in the etching step.

The method may be a laser processing method for forming the object with a plurality of through holes, further comprising an insulating film producing step of producing an insulating film on an inner face of the through holes in the object after the etching step. When forming a plurality of through-hole electrodes by embedding a conductor in each of a plurality of through holes, for example, this can secure insulation between the through-hole electrodes adjacent to each other.

Advantageous Effects of Invention

The laser processing method in accordance with the present invention can accurately form a through hole and facilitate the processing.

BRIEF DESCRIPTION OF DRAWINGS

FIG. 8 (a) is a flow diagram explaining the laser processing method in accordance with an embodiment, while (b) is a flow diagram illustrating a stage subsequent to FIG. 8(a);

FIG. 9 (a) is a flow diagram illustrating a stage subsequent to FIG. 8(b), while (b) is a flow diagram illustrating a stage subsequent to FIG. 9(a);

FIG. 11 (a) is a flow diagram illustrating a stage subsequent to FIG. 9(b), while (b) is a flow diagram illustrating a stage subsequent to FIG. 11(a); and FIG. 12 (a) is a flow diagram illustrating a stage subsequent to FIG. 11(b), while (b) is a flow diagram illustrating a stage subsequent to FIG. 12(a).

DESCRIPTION OF EMBODIMENTS

In the following, preferred embodiments of the present invention will be explained in detail with reference to the drawings. In the following explanations, the same or equivalent constituents will be referred to with the same signs while omitting their overlapping descriptions.

The laser processing method in accordance with an embodiment converges laser light into an object to be processed, so as to form a modified region. Therefore, the forming of the modified region will firstly be explained in the following with reference to FIGS. 1 to 6.

Figure 1:
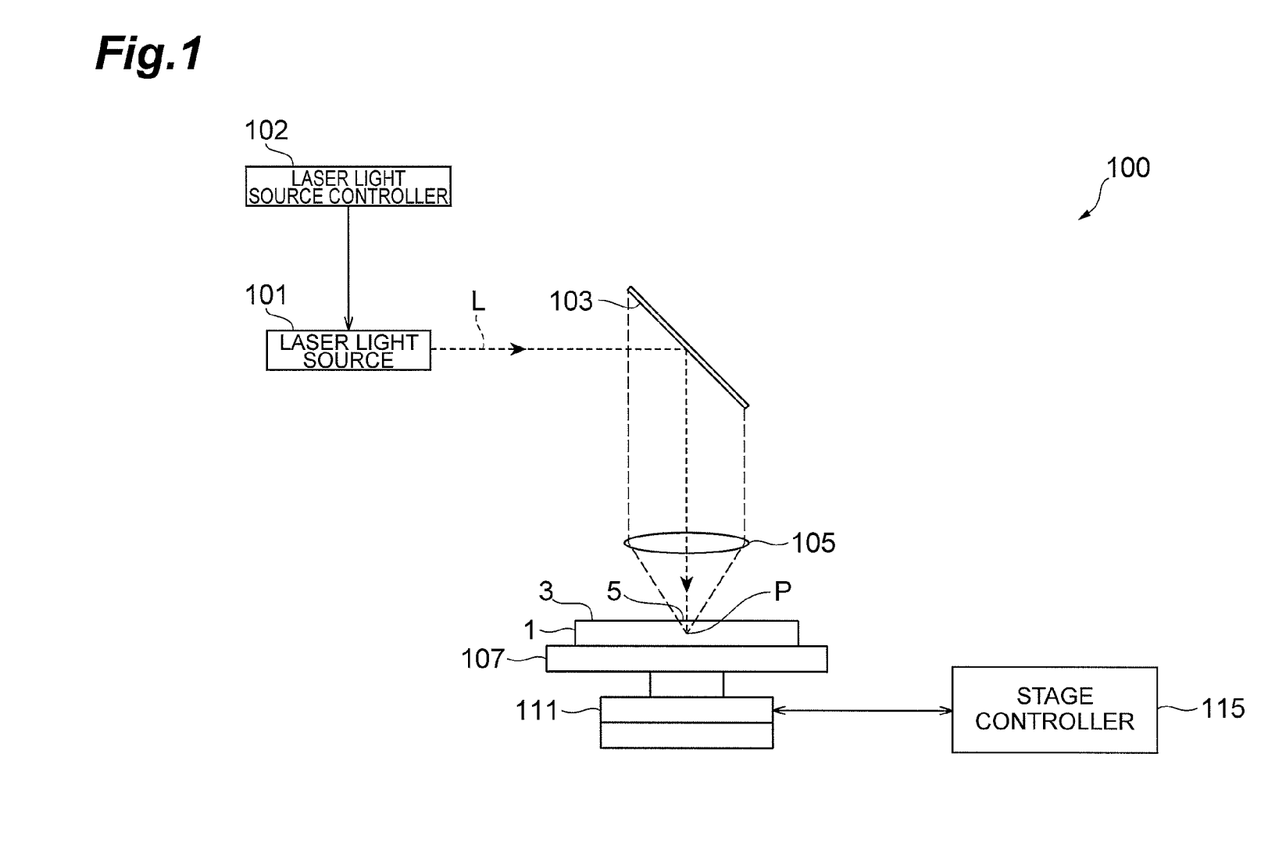
FIG. 1 is a schematic structural diagram of a laser processing device used for forming a modified region.

As illustrated in FIG. 1, a laser processing device 100 comprises a laser light source 101 which causes laser light L to oscillate in a pulsating manner, a dichroic mirror 103 arranged such as to change the direction of the optical axis (optical path) of the laser light L by 90°, and a condenser lens 105 for converging the laser light L. The laser processing device 100 also comprises a support table 107 for supporting an object to be processed 1 irradiated with the laser light L converged by the condenser lens 105, a stage 111 for moving the support table 107, a laser light source controller 102 for controlling the laser light source 101 in order to regulate the output, pulse width, and the like of the laser light L, and a stage controller 115 for controlling the movement of the stage 111.

In the laser processing device 100, the laser light L emitted from the laser light source 101 changes the direction of its optical axis by 90° with the dichroic mirror 103 and then is converged by the condenser lens 105 into the object 1 mounted on the support table 107. At the same time, the stage 111 is shifted, so that the object 1 moves relative to the laser light L along a part to form a modified region 5. This forms a modified region in the object 1 along the part 5.

Figure 2:
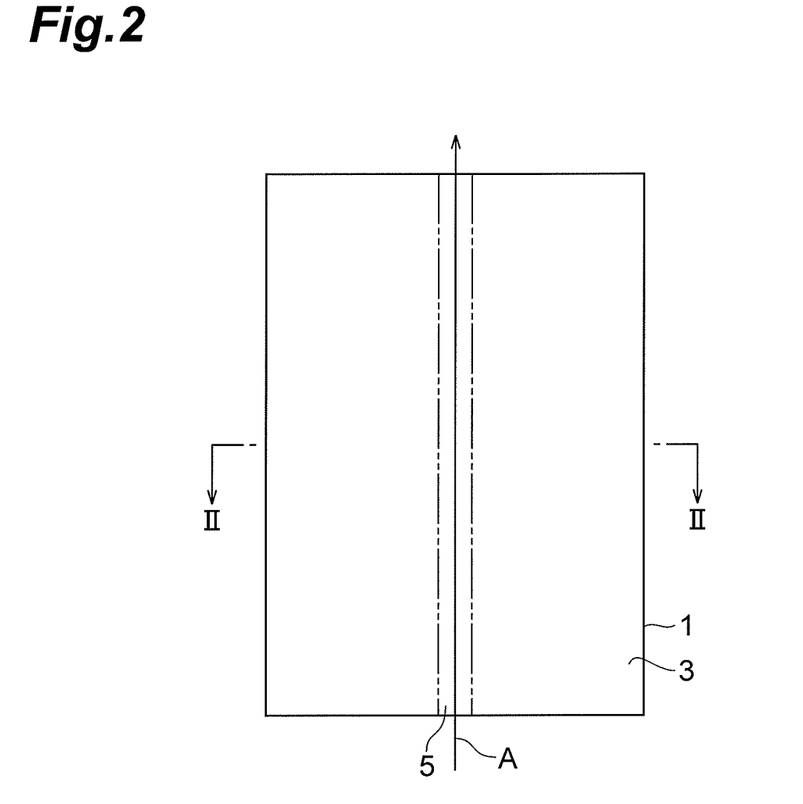
FIG. 2 is a plan view of an object to be processed in which the modified region is to be formed.
Figure 3:
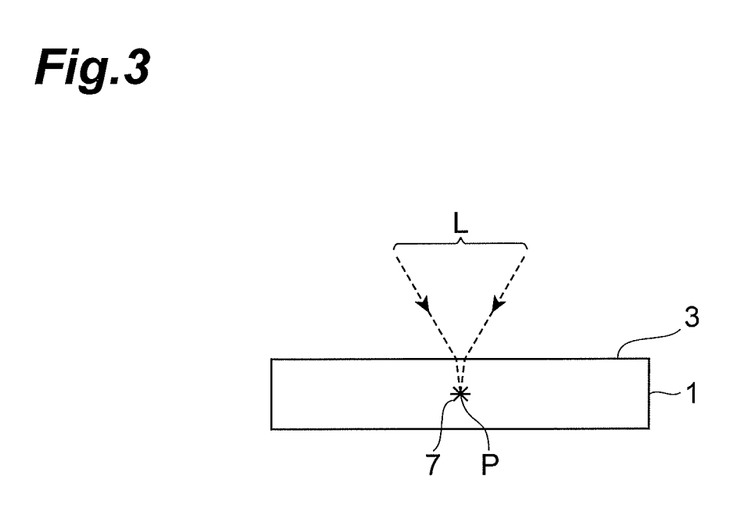
FIG. 3 is a sectional view of the object taken along the line III-III of FIG. 2.
Figure 4:
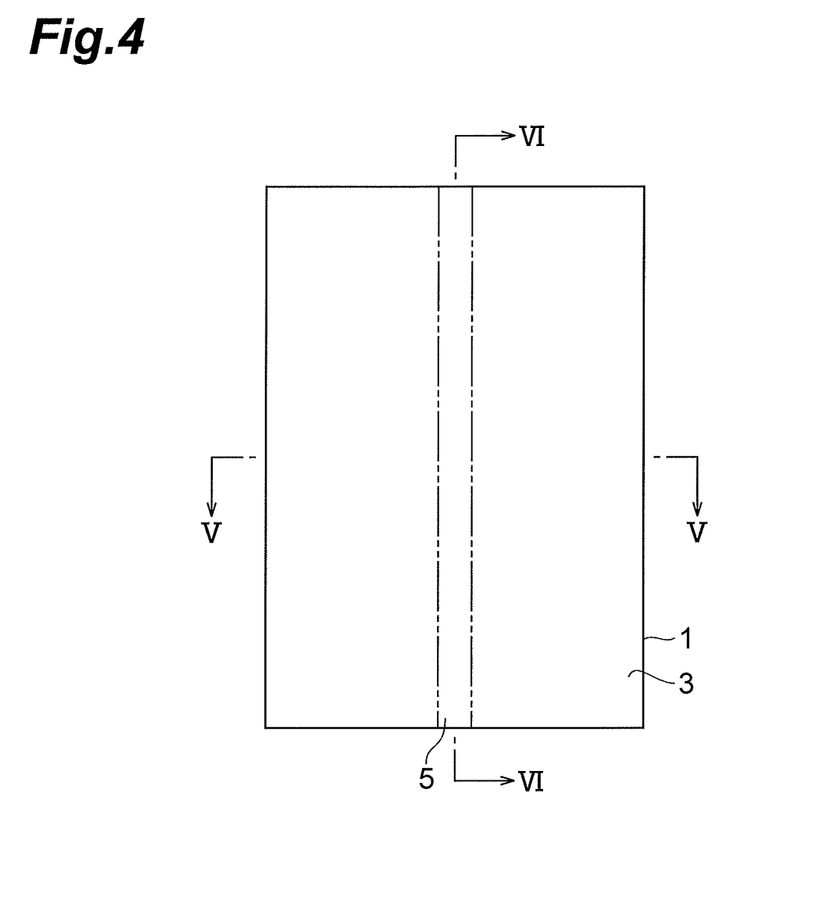
FIG. 4 is a plan view of the object after laser processing.
Figure 5:
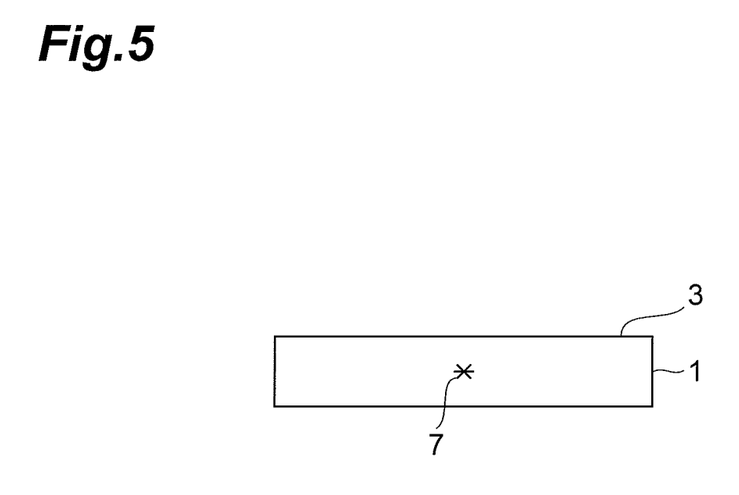
FIG. 5 is a sectional view of the object taken along the line V-V of FIG. 4.
Figure 6:
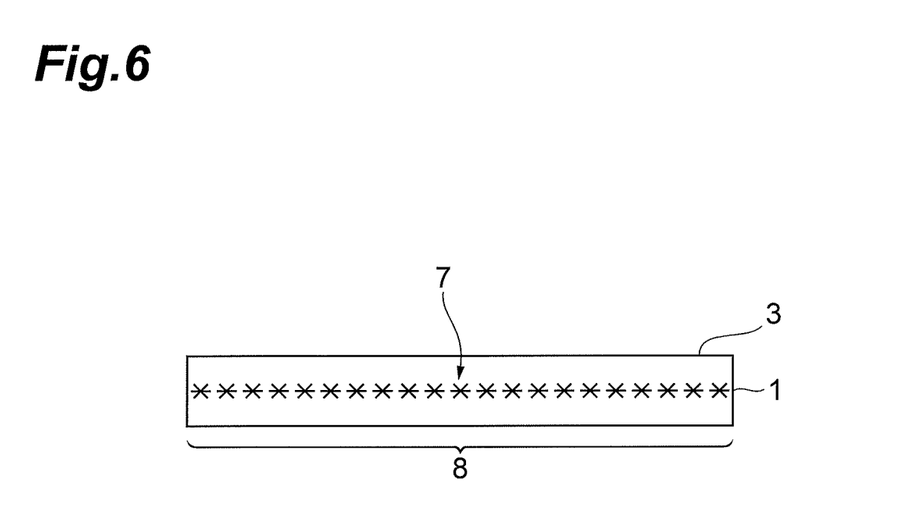
FIG. 6 is a sectional view of the object taken along the line VI-VI of FIG. 4.

As illustrated in FIG. 2, the part 5 is set in the object 1, for which a semiconductor material, a piezoelectric material, or the like is used. Here, the part 5 is a virtual line extending straight. When forming a modified region within the object 1, the laser light L is relatively moved along the part 5 (i.e., in the direction of arrow A in FIG. 2) while locating a converging point P within the object 1 as illustrated in FIG. 3. This forms a modified region 7 within the object 1 along the part 5 as illustrated in FIGS. 4 to 6, whereby the modified region 7 becomes a removing region 8 to be removed by etching which will be explained later.

The converging point P is a position at which the laser light L is converged. The part 5 may be curved instead of being straight, shaped into a three-dimensional curved or planar surface form, or specified in terms of coordinates. The modified region 7 may be formed either continuously or intermittently. The modified region 7 may be formed like lines or dots. It will be sufficient if the modified region 7 is formed at least within the object 1. There are cases where fractures are formed from the modified region 7 acting as a start point, and the fractures and modified region 7 may be exposed at outer surfaces (the front face, rear face, and outer peripheral face) of the object 1.

Here, the laser light L is absorbed in particular in the vicinity of the converging point within the object 1 while being transmitted therethrough, whereby the modified region 7 is formed in the object 1 (i.e., internal absorption type laser processing). In the case of forming a removing part such as a hole or groove by melting it away from the front face 3 (surface absorption type laser processing), the processing region gradually progresses from the front face 3 side to the rear face side in general.

The modified region 7 in accordance with this embodiment means regions whose physical characteristics such as density, refractive index, and mechanical strength have attained states different from those of their surroundings. Examples of the modified region 7 include molten processed regions, crack regions, dielectric breakdown regions, refractive index changed regions, and their mixed regions. Further examples of the modified region 7 include an area where the density has changed from that of an unmodified region in a material of the object 1 and an area formed with a lattice defect (which may collectively be referred to as a high-density transitional region).

The molten processed regions, refractive index changed regions, areas where the modified region has a density different from that of the unmodified region, or areas formed with a lattice defect may further incorporate a fracture (cut or microcrack) therewithin or at an interface between the modified region 7 and an unmodified region. The incorporated fracture may be formed over the whole surface of the modified region 7 or in only a part or a plurality of parts thereof. Examples of the object 1 include those containing or constituted by silicon.

Here, this embodiment forms the object 1 with the modified region 7 and then etches the object 1, so as to advance the etching selectively along fractures (also known as cracks, microcracks, cuts, and the like; hereinafter simply referred to as "fractures") included in or extending from the modified region 7, thereby removing a part extending along the modified region 7 in the object 1.

In the etching in this embodiment, for example, a capillary action or the like is utilized so that fractures included in or extending from the modified region 7 are impregnated with an etchant, so as to advance the etching along fracture surfaces. This advances the etching selectively at a higher etching rate along the fractures in the object 1 and removes them. Also, by utilizing the characteristic feature that the etching rate of the modified region 7 itself is high, the etching is selectively advanced along the modified region 7, so as to remove it.

Examples of the etching include a case where the object 1 is immersed in the etchant (dipping) and a case where the object 1 is coated with the etchant while being rotated (spin etching). The etching herein encompasses isotropic etching and anisotropic etching.

Figure 7:
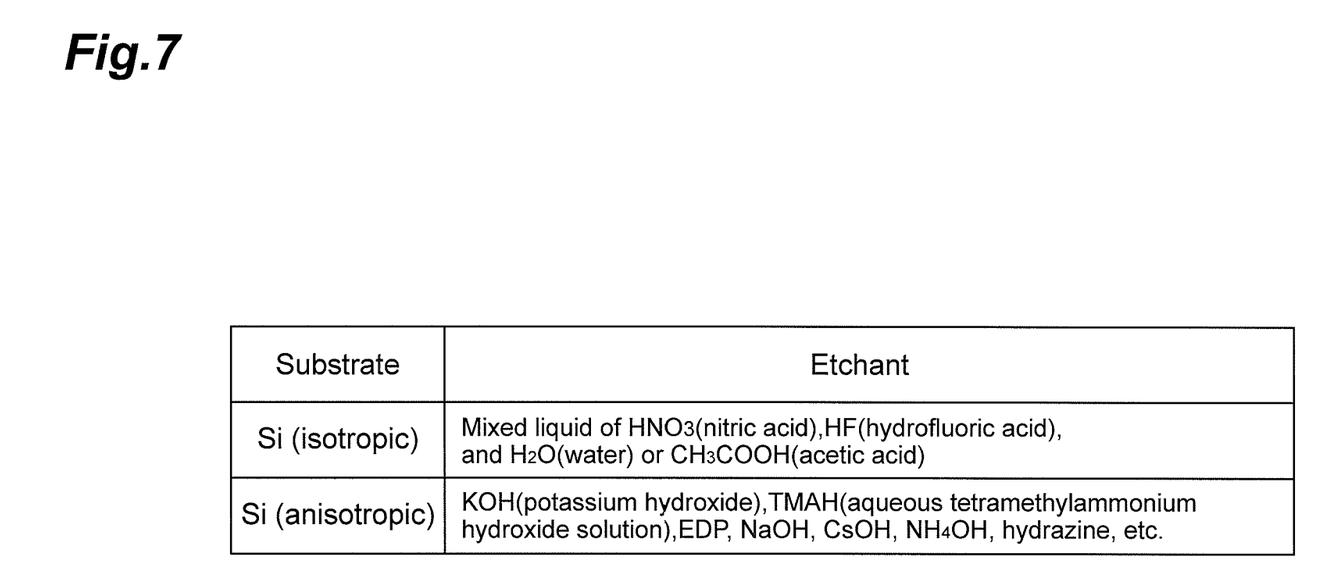
FIG. 7 is a chart illustrating examples of etchants.
Figure 8:
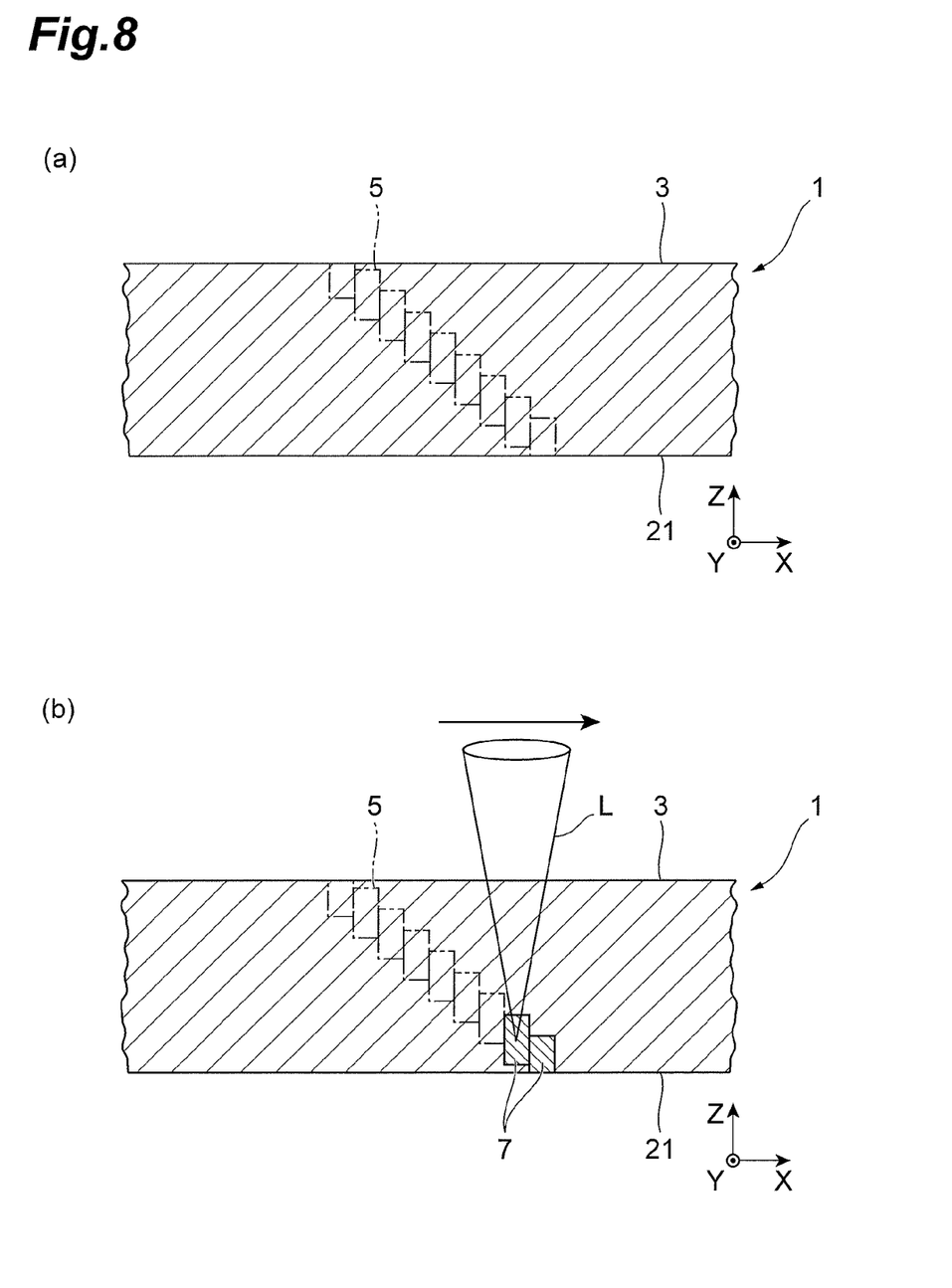
Figure 9:
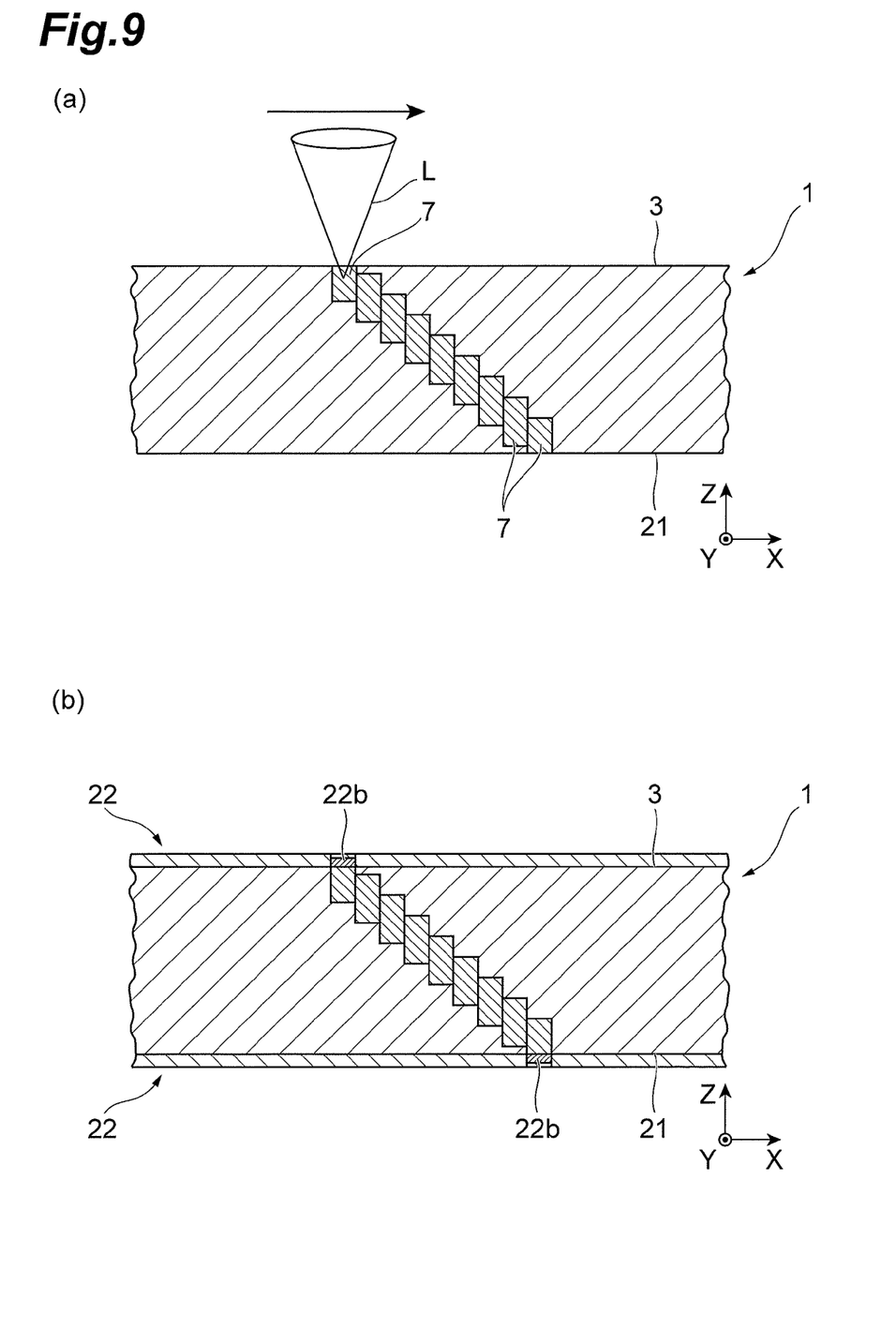

FIG. 7 is a chart illustrating examples of etchants for use. Each etchant is used at a temperature ranging from ambient temperature to about 100° C., which is set appropriately according to a required etching rate or the like. When etching Si (anisotropic) with KOH, for example, the temperature is preferably about 60° C. The etchant employable is not limited to liquids but may be in the form of a gel (jelly or semisolid).

The isotropic etching is applicable to relatively thin objects to be processed (having a thickness of 10 μm to 100 μm, for example), so that the etching can advance isotropically independent of the crystal orientation and the modified region. When a fracture is exposed to the front face in this case, the etchant travels through the fracture to wet the inside, so that the whole surface in the thickness direction becomes a start point for the modified region, whereby a chip etched such that its cut surface is depressed into a semicircular form can be taken out. On the other hand, the anisotropic etching is applicable not only to relatively thin objects to be processed but also to thick ones (having a thickness of 800 μm to 100 μm, for example). In this case, even when the surface to be formed with the modified region differs from its plane direction, the etching can be advanced along the modified region. That is, the anisotropic etching herein enables not only the etching of the plane direction in conformity to the crystal orientation, but also the etching independent of the crystal orientation.

The laser processing method in accordance with an embodiment of the present invention will now be explained in detail. FIGS. 8 to 12 are flow diagrams illustrating the laser processing method in accordance with this embodiment.

Figure 12:
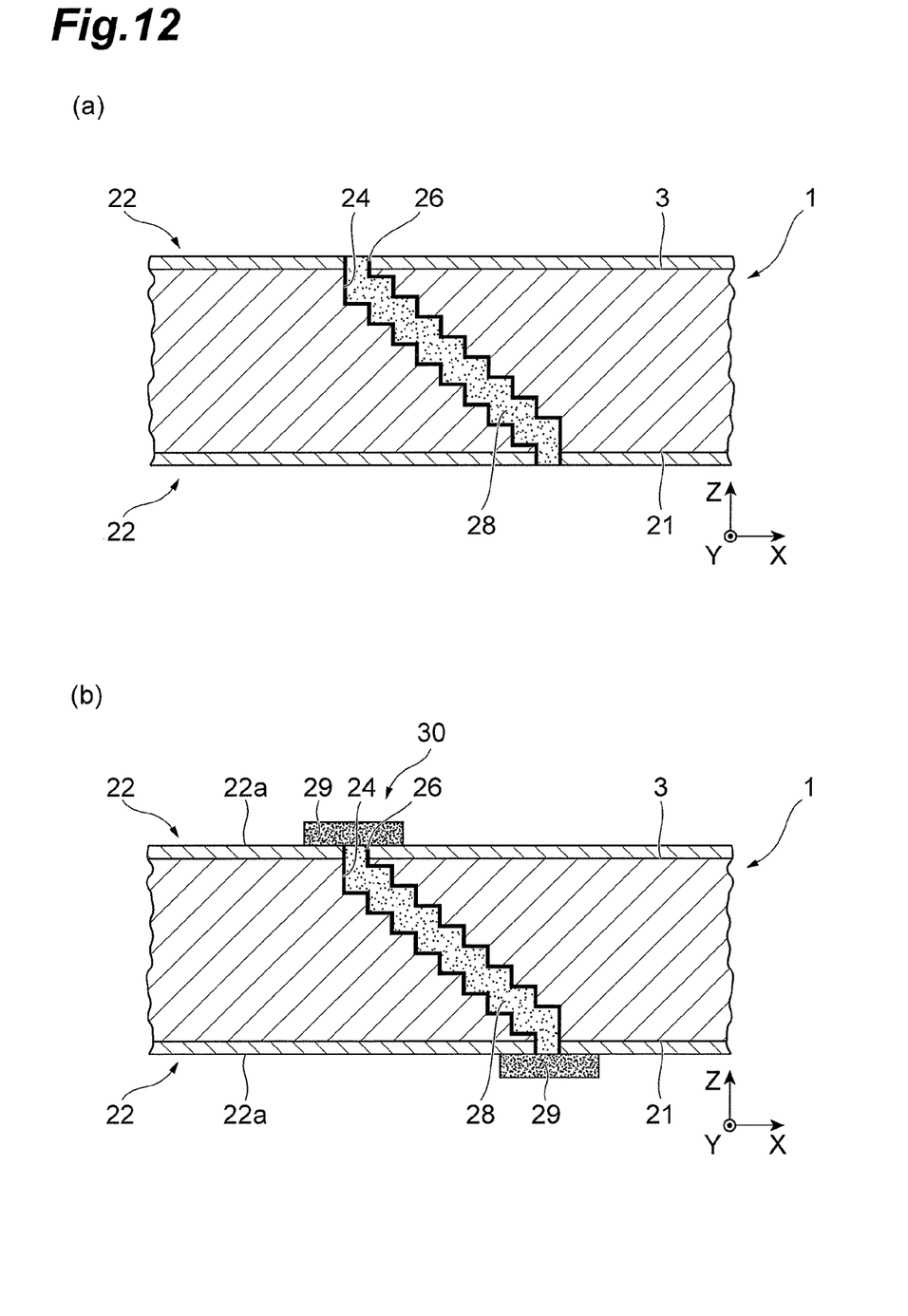

As illustrated in FIGS. 8 to 12, this embodiment is a processing method for manufacturing a component (such as an interposer) which electrically connects a semiconductor device and a printed wiring board or flexible substrate to each other, for example, the method forming the object 1 with a plurality of through holes 24 (see FIG. 11) and embedding a conductor into the through holes 24, thereby producing a plurality of through-hole electrodes 30 (see FIG. 12).

As illustrated in FIG. 8(a), the object 1 is a sheet-like silicon substrate transparent to the wavelength (e.g., 1064 nm) of the laser light L with which it is irradiated and has its front face 3 and rear face 21 (main faces) in (100) planes. In the object 1, parts to form modified regions 5 are set as being specified by three-dimensional coordinates along the parts corresponding to the through holes 24. Each part 5 is set such as to extend in a direction tilted with respect to the thickness direction of the object 1. The part 5 here is set such as to extend along a (111) plane of the object 1.

The following explanation will assume the thickness direction of the object 1 (irradiation direction of the laser light L) to be the Z direction, a direction to which the parts 5 (through holes 24) tilt with respect to the thickness direction to be the X direction, and a direction perpendicular to the X and Z directions to be the Y direction.

First, when processing the object 1 in this embodiment, the object 1 is mounted and held on the mount table with the front face 3 side facing up as illustrated in FIG. 8(a). Then, while locating a converging point of the laser light L (hereinafter simply referred to as "converging point") at a position near the rear face 21 of the object 1 in the Z direction and relatively moving the converging point in the X direction, irradiation with the laser light L (scan) is performed in an on/off manner from the front face 3 side such that a modified region 7 is formed in the part 5.

This forms the modified region 7 exposed to the rear face 21 in the part corresponding to the through hole 24 in the vicinity of the rear face 21 in the object 1. In other words, the modified region 7 is formed on the rear face 21 side such as to damage the rear face 21 of the object 1. Here, since spot irradiation is performed with pulsed laser light as the laser light L, the resulting modified region 7 is constituted by modified spots. Thus formed modified region 7 incorporates therein fractures generated from the modified region 7 (ditto in the following modified regions).

Subsequently, as illustrated in FIG. 8(b), the position of the converging point is shifted in the Z direction toward the front face 3, and then the above-mentioned X-direction scan is performed. This newly forms a modified region 7 joining with the existing modified region 7 in the part corresponding to the through hole 24 at the position closer to the front face 3 than is the existing modified region 7 in the Z direction.

Then, the above-mentioned X-direction scan is repeatedly performed while progressively changing the position of the converging point in the Z direction from the rear face 21 side to the front face 3 side. This forms modified regions 7 joining with each other along the part corresponding to the through hole 24 within the object 1. That is, the modified regions 7 tilted with respect to the Z direction along the (111) plane of the object 1 are formed within the object 1.

Thereafter, as illustrated in FIG. 9(a), the above-mentioned X-direction scan is performed while locating the converging point at the position near the front face 3 of the object 1 in the Z direction. This forms a modified region 7 joining with the existing modified region 7 while being exposed to the front face 3 in the part corresponding to the through hole 24 in the vicinity of the front face 3 in the object 1. In other words, the modified region 7 continuous with the existing modified region 7 is formed on the front face 3 side such as to damage the front face 3 of the object 1.

Next, as illustrated in FIG. 9(b), the object 1 is put into a furnace having an internal temperature of 1000° C., for example, so as to oxidize its whole surface by wet oxidation. This forms an oxide film 22 as an etch resist film resistant to etching on outer surfaces (at least the front face 3 and rear face 21) of the object. Here, the oxide film 22 is a thermally-oxidized film which is highly resistant to alkali etching liquids which are etchants.

Figure 10:
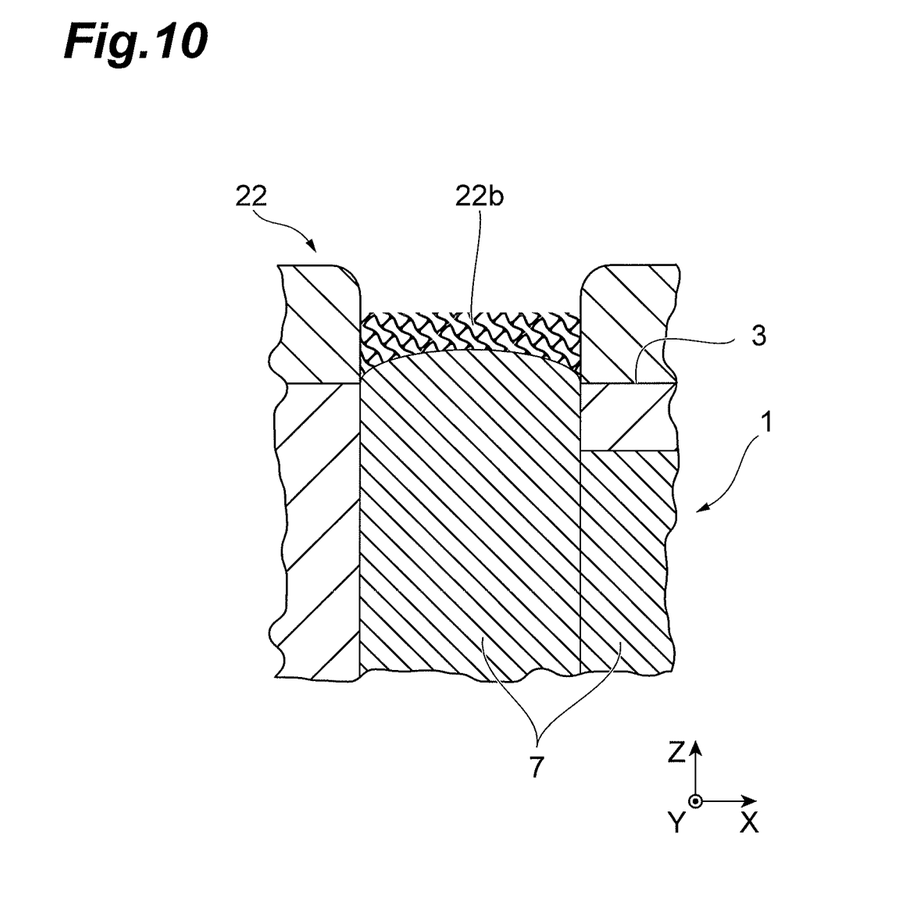
FIG. 10 is a view enlarging a part of the object in FIG. 9(b)
Figure 11:
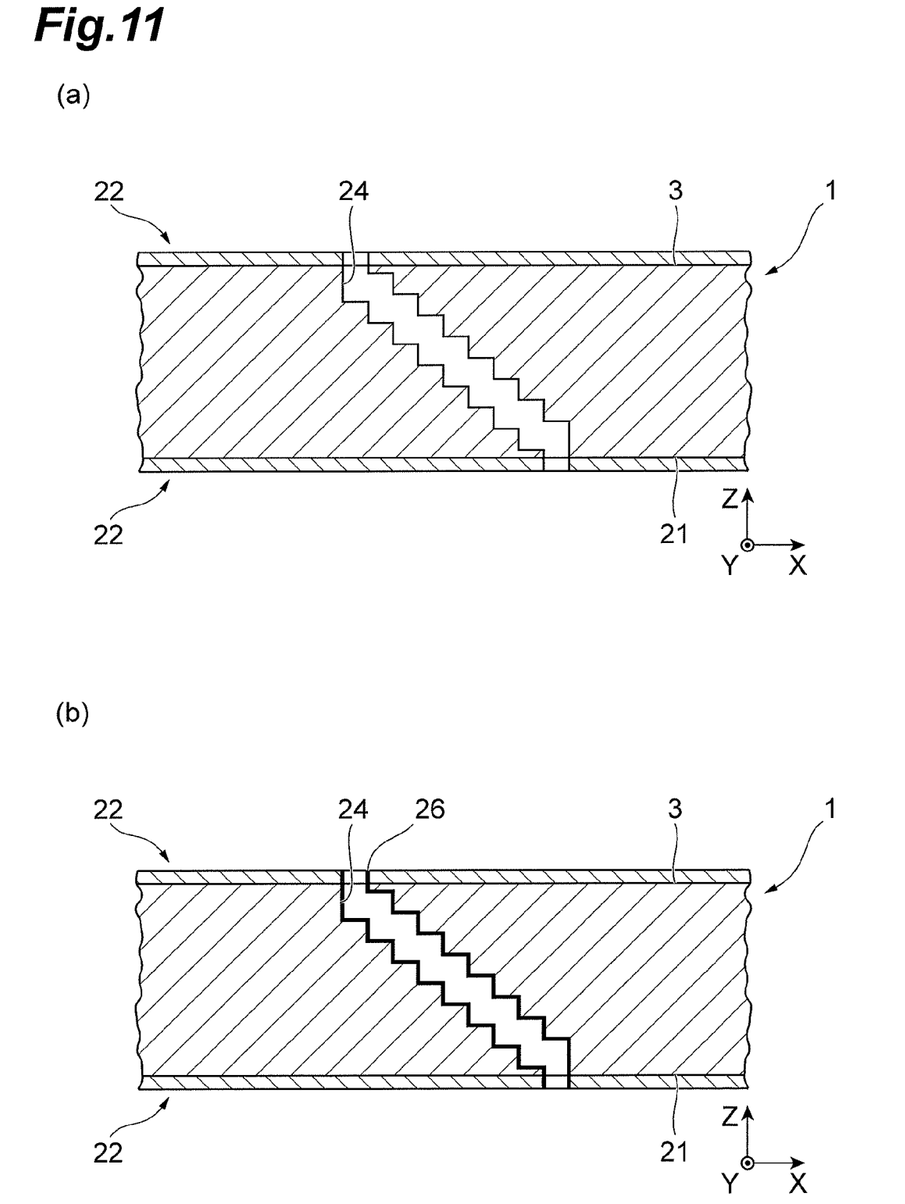

Here, as illustrated in FIG. 10, the surfaces of the modified regions 7 exposed to the front face 3 and rear face 21 of the object 1 are not smooth but rough because of their characteristics, whereby many fractures (cracks) included in the modified region 7 are exposed, thus yielding a fuzzy state. This inhibits the oxide film 22 from growing when producing the same (see FIG. 9(b)), thereby causing an error in forming the oxide film 22. Therefore, the oxide film 22 is not substantially produced on this modified region 7 or is produced coarser in terms of density than its surroundings, whereby defects 22b occur in the oxide film 22.

Subsequently, as illustrated in FIG. 11(a), the object 1 is etched for 60 minutes with KOH at 85° C., for example, employed as an etchant. Specifically, the etchant is caused to infiltrate from the defects 22b of the oxide film 22 into the modified regions 7 and advance selectively along the modified regions 7 and fractures included in the modified regions 7. This selectively removes the inside of the modified regions 7, thereby forming the through hole 24 tilted with respect to the Z direction in conformity to the (111) plane. The defects 22b of the oxide film 22 are peeled off and removed when the etching advances.

Anisotropic etching is performed as the etching in this embodiment, while the (111) plane of the object 1 is harder to etch (exhibits a lower etching rate). Therefore, when the modified regions 7 extend along the (111) plane as in this embodiment, the etching favorably advances along the modified regions 7. Also, the inner face of the through hole 24 becomes a smooth surface with less irregularities, while the cross section of the through hole 24 attains a rectangular (diamond) form.

Next, as illustrated in FIG. 11(b), the object 1 is oxidized again by wet oxidation. This forms an oxide film 26 as an electrically insulating film on the inner face of the through hole 24. Thereafter, a conductor 28 is embedded into the through hole 24 as illustrated in FIG. 12(a), and electrode pads 29 are formed on the outer surfaces 22a of the oxide film 22 on the front face 3 side and rear face 21 side so as to electrically connect with the conductor 28, respectively, as illustrated in FIG. 12(b), whereby the through-hole electrode 30 is constructed.

As in the foregoing, this embodiment performs laser processing for forming the modified region 7 exposed to the rear face 21, the modified regions 7 within the object 1, and the modified region 7 exposed to the front face 3. Here, the oxide film 22 is formed on the front face 3 and rear face 21 by oxidation on the whole surface. During this time, the oxide film 22 is inhibited from growing on the exposed modified regions 7, whereby the defects 22b occur. Hence, in the subsequent etching, while the etchant reliably enters from the defects 22b of the oxide film 22 as base points, the etching advances selectively along the modified regions 7.

Therefore, a conventional step of patterning by exposure to light or the like is unnecessary in this embodiment for forming the oxide film 22 on the front face 3 and rear face 21 of the object 1, whereby the through hole 24 can be formed accurately, while the processing can be facilitated. This can further restrain the opening side of the through hole 24 from widening and the modified region 7 from being etched in excess and thereby increasing the cross-sectional area of the through hole 24 and so forth, whereby the form and size of the through hole 24 can be controlled favorably. The oxide film 22 can also inhibit the object 1 from reducing the thickness upon etching and keep the surface accuracy in the front face 3 and rear face 21.

This embodiment can produce the patterned oxide film 22 by a step of oxidizing the whole surface of the object 1 alone, thereby achieving a high accuracy in aligning the oxide film 22 and the object 1 with each other.

In this embodiment, as mentioned above, the object 1 is shaped like a sheet having the front face 3 and rear face 21 in (100) planes and thus is easier to etch in the tilted direction of the through hole 24 (i.e., a direction along the (111) plane) by anisotropic etching. Therefore, this embodiment can favorably form the object 1 with the tilted through hole 24.

As mentioned above, this embodiment produces the oxide film 26 as an insulating film on the inner face of the through hole 24. This can reliably secure insulation between the through-hole electrodes 30 adjacent to each other.

This embodiment produces the oxide film 22 after forming the modified region 7 as mentioned above and thus can inhibit the laser light L from reducing its energy upon passing through the oxide film 22. This effect becomes remarkable when the front face 3 of the object 1 has already been formed with a device, since the device also lowers the energy of the laser light L.

Recently, as integration has been becoming higher, there have been stronger demands for developing interposers having fine wiring pitches. In this regard, this embodiment, which can form the through-hole electrodes 30 tilted with respect to the Z direction, exhibits the following operations and effects. That is, when attaining a fine wiring pitch, the electrode pad 29 on the front face 3 side and the electrode pad 29 on the rear face 21 side can be connected directly to each other, so as to secure a wiring width sufficiently, thereby preventing the electric resistance from increasing.

This embodiment can repeatedly perform the X-direction scan while changing the converging point position in the Y direction (laser processing on the XY plane) and repeatedly perform the same while changing the converging point position in the Z direction, so as to form modified regions 7 corresponding to a plurality of through holes 24. The method may repeatedly perform the X-direction scan while changing the converging point position in the Z direction (laser processing on the XZ plane) and repeatedly perform the same while changing the converging point position in the Y direction. The method may form a modified region 7 corresponding to one through hole 24 by irradiation with the laser light L while appropriately moving the converging point in the X, Y, and Z directions and repeatedly perform the same by the number corresponding to that of through holes 24.

Though a preferred embodiment of the present invention has been explained in the foregoing, the present invention is not limited thereto but may be modified or applied to others within the scope not changing the gist recited in each claim.

For example, the laser light entrance surface for forming the modified regions is not limited to the front face 3 of the object 1, but may be the rear face 21 of the object 1. Though the above-mentioned embodiment produces the oxide film 22 as an etch resist film, a nitride film may be formed. The etch resist film may be anything as long as it is resistant to the etchant used in the etching.

After producing the oxide film 22 before etching, the oxide film 22 may be etched separately, so as to remove the defects 22b. This allows the etchant to infiltrate reliably into the modified regions 7 in the etching for the object 1 in a later stage, whereby the through holes 24 can be formed accurately.

The on/off irradiation with the laser light L in the above-mentioned embodiment may be performed not only by controlling the on/off of the emission of the laser light L, but also by opening/closing a shutter disposed on the optical path of the laser light L or by masking on/off the front face 3 of the object 1, for example. Further, the intensity of the laser light L may be controlled between an intensity at a threshold for forming the modified regions 7 (processing threshold) or higher and an intensity lower than the processing threshold.

INDUSTRIAL APPLICABILITY

The laser processing method of the present invention can form through holes accurately and facilitate the processing.

REFERENCE SIGNS LIST

1 . . . object to be processed; 3 . . . front face (outer surface; main face); 7 . . . modified region; 21 . . . rear face (outer surface; main face); 22 . . . oxide film (etch resist film); 24 . . . through hole; 26 . . . oxide film (insulating film); L . . . laser light; P . . . converging point

The invention claimed is:

1. A laser processing method of converging laser light into an object to be processed made of silicon so as to form a modified region and etching the object along the modified region so as to form the object with a through hole, the method comprising:
   a laser light converging step of converging the laser light at the object so as to form the modified region along a part corresponding to the through hole in the object;
   an etch resist film producing step of producing an etch resist film resistant to etching on an outer surface of the object after the laser light converging step; and
   an etching step of etching the object so as to advance the etching selectively along the modified region and form the through hole after the etch resist film producing step;
   wherein the laser light converging step exposes the modified region to the outer surface of the object, forming the modified region including a surface exposed to the outer surface;
   wherein the etch resist film producing step performs the production of the etch resist film with respect to the outer surface and the surface of the modified region; and
   wherein the etching step infiltrates an etchant from defects of the etch resist film formed on the surface of the modified region into the modified region, etches the modified region, forming the through hole.

2. A laser processing method according to claim 1, wherein the object is shaped like a sheet having a main face in a (100) plane;
   wherein the through hole tilts with respect to the thickness direction of the object; and
   wherein the etching step performs anisotropic etching as the etching.

3. A laser processing method according to claim 1, further comprising a step of removing the etch resist film produced on the exposed modified region by etching the etch resist film after the etch resist film producing step before the etching step.

4. A laser processing method according to claim 1, for forming the object with a plurality of through holes, the method further comprising an insulating film producing step of producing an insulating film on an inner face of the through holes in the object after the etching step.

* * * * *